(12) United States Patent
Gao

(10) Patent No.: US 11,387,296 B2
(45) Date of Patent: Jul. 12, 2022

(54) FLEXIBLE DISPLAY PANEL INCLUDING A PLURALITY OF PENETRATING HOLES

(71) Applicant: Wuhan China Star Optoelectronics Semiconductor Display Technology Co., Ltd., Wuhan (CN)

(72) Inventor: Hong Gao, Wuhan (CN)

(73) Assignee: Wuhan China Star Optoelectronies Semiconductor Display Technology Co., Ltd., Wuhan (CN)

( * ) Notice: Subject to any disclaimer, the term of this patent is extended or adjusted under 35 U.S.C. 154(b) by 297 days.

(21) Appl. No.: 16/612,757

(22) PCT Filed: Sep. 20, 2019

(86) PCT No.: PCT/CN2019/106835
§ 371 (c)(1),
(2) Date: Nov. 12, 2019

(87) PCT Pub. No.: WO2020/248425
PCT Pub. Date: Dec. 17, 2020

(65) Prior Publication Data
US 2021/0359038 A1     Nov. 18, 2021

(30) Foreign Application Priority Data
Jun. 10, 2019 (CN) .......................... 201910497974.8

(51) Int. Cl.
*H01L 27/32* (2006.01)
*H01L 33/12* (2010.01)
(Continued)

(52) U.S. Cl.
CPC ...... *H01L 27/3244* (2013.01); *H01L 51/5253* (2013.01); *H01L 51/56* (2013.01);
(Continued)

(58) Field of Classification Search
CPC ............ H01L 27/3244; H01L 27/3246; H01L 27/3258; H01L 27/32; H01L 33/12;
(Continued)

(56) References Cited

U.S. PATENT DOCUMENTS 10,182,474 B2 *  1/2019  Kim ..................... H01L 51/0097
2016/0014522 A1 * 1/2016  Matsumura ............. H04R 7/18
                                                                    381/398
(Continued)

FOREIGN PATENT DOCUMENTS

| CN | 108110031 | 6/2018 |
| CN | 109148534 | 1/2019 |
| CN | 109378339 | 2/2019 |

*Primary Examiner* — Ida M Soward

(57) ABSTRACT

A flexible display panel and a method of fabricating the same are provided. The flexible display panel has a display region and a bending region. The flexible display panel has a substrate, an organic pattern layer, layered structures, first holes, and second holes. The organic pattern layer is at the bending region and disposed on the substrate. The layered structures cover the organic pattern layer and the substrate located at the display region. The first holes pass through the layered structures and the organic pattern layer located at the bending region. The second holes pass through the layered structures located at the display region, wherein the second holes are adjacent to the bending region. When the bending portion is bent, the flexible display panel has a specific bending shape by disposing an organic pattern layer. Further, the first holes and the second holes are formed to balance stress.

8 Claims, 3 Drawing Sheets

(51) Int. Cl.
  *H01L 33/44*    (2010.01)
  *H01L 51/50*    (2006.01)
  *H01L 51/52*    (2006.01)
  *G02F 1/13*     (2006.01)
  *H01L 51/56*    (2006.01)
  *G02F 1/1333*   (2006.01)

(52) U.S. Cl.
  CPC .......... *G02F 1/133305* (2013.01); *G09G 2300/0408* (2013.01); *H01L 33/12* (2013.01); *H01L 33/44* (2013.01); *H01L 2251/5338* (2013.01)

(58) Field of Classification Search
  CPC ..... H01L 33/44; H01L 51/5253; H01L 51/50; H01L 51/52; H01L 2251/53; H01L 2251/5338; G02F 1/133305; G09G 2300/0408
  See application file for complete search history.

(56) References Cited

U.S. PATENT DOCUMENTS

| | | | |
|---|---|---|---|
| 2018/0090698 A1* | 3/2018 | Jeong | H01L 51/0097 |
| 2018/0301520 A1* | 10/2018 | Jin | H01L 27/124 |
| 2018/0315809 A1* | 11/2018 | Kim | H01L 27/3276 |
| 2018/0342709 A1 | 11/2018 | Song et al. | |
| 2018/0366586 A1* | 12/2018 | Son | H01L 27/1262 |
| 2019/0132987 A1* | 5/2019 | Koo | H05K 5/0217 |
| 2019/0269011 A1* | 8/2019 | Lee | G06F 1/1652 |
| 2020/0066824 A1* | 2/2020 | Rhe | G06F 3/0446 |
| 2020/0295282 A1* | 9/2020 | Xiang | H01L 27/3253 |
| 2021/0359070 A1* | 11/2021 | Jin | H01L 27/3276 |

* cited by examiner

FLEXIBLE DISPLAY PANEL INCLUDING A PLURALITY OF PENETRATING HOLES

RELATED APPLICATIONS

This application is a National Phase of PCT Patent Application No. PCT/CN2019/106835 having International filing date of Sep. 20, 2019, which claims the benefit of priority of Chinese Patent Application No. 201910497974.8 filed on Jun. 10, 2019. The contents of the above applications are all incorporated by reference as if fully set forth herein in their entirety.

FIELD AND BACKGROUND OF THE INVENTION

The present disclosure relates to a display panel and a method of fabricating the same, and more particularly to a flexible display panel and a method of fabricating the same.

The flexible OLED display technology continues to mature, and a variety of flexible display products are constantly diversified. Frameless display products have become a mainstream in the market, and process requirements are also getting higher and higher. Among them, a bending technology of a panel driving region has become a key to determining a yield. A bending process of the panel driving region is to bend and fit the panel driving region to a back portion of a panel, thereby saving an occupied space of a driving region so as to improve a screen ratio, thereby achieving a full screen display effect.

However, in the conventional technologies, the bending region is affected by stress when it is bent, so it is necessary to strengthen a structural strength of the bending region. However, a structure of an existing bending region still fails to meet structural strength requirements.

Therefore, it is necessary to provide a flexible display panel and a method of fabricating the same to solve the problems of the conventional technologies.

SUMMARY OF THE INVENTION

From above, the present disclosure provides a flexible display panel and a method of fabricating the same, which solve the problems that a structure of the existing bending region still cannot meet requirements of a structural strength existing in the conventional technologies.

An object of the present disclosure is to provide a flexible display panel and a method of fabricating the same, where a plurality of first holes and a plurality of second holes are formed at specific positions to solve and balance a stress experienced by the bending region.

To achieve the above object of the present disclosure, an embodiment of the present disclosure provides a flexible display panel, wherein the flexible display panel has a display region and a bending region, and the flexible display panel comprises: a substrate, an organic pattern layer, a plurality of layered structures, a plurality of first holes, and a plurality of second holes. The organic pattern layer is located at the bending region and disposed on the substrate. The plurality of layered structures cover the organic pattern layer and the substrate located at the display region, wherein the plurality of layered structures comprises: a protective layer, an organic layer, a line layer, a flat layer, a pixel defining layer, a spacing material layer, and a dispensing layer. The protective layer covers the organic pattern layer and the substrate located at the display region. The organic layer is disposed on the protective layer. The line layer is disposed on the organic layer. The flat layer is disposed on the line layer. The pixel defining layer is disposed on the flat layer. The spacing material layer is disposed on the pixel defining layer. The dispensing layer is disposed on the spacing material layer located at the bending region. The plurality of first holes pass through the plurality of layered structures and the organic pattern layer located at the bending region. The plurality of second holes pass through the plurality of layered structures located at the display region, wherein the plurality of second holes are adjacent to the bending region. The plurality of first holes pass through the plurality of layered structures and the organic pattern layer located at the bending region. The plurality of second holes pass through the plurality of layered structures located at the display region, wherein the plurality of second holes are adjacent to the bending region. The plurality of first holes and the plurality of second holes have a first hole density and a second hole density, respectively, wherein the first hole density is greater than the second hole density.

In an embodiment of the present disclosure, a thickness of the protective layer on the organic pattern layer is smaller than a thickness of the protective layer on the substrate of the display region.

In an embodiment of the present disclosure, material of the protective layer comprises polyimide.

To achieve the above object of the present disclosure, an embodiment of the present disclosure provides a flexible display panel, wherein the flexible display panel has a display region and a bending region, and the flexible display panel comprises: a substrate, an organic pattern layer, a plurality of layered structures, a plurality of first holes, and a plurality of second holes. The organic pattern layer is located at the bending region and disposed on the substrate. The plurality of layered structures cover the organic pattern layer and the substrate located at the display region. The plurality of first holes pass through the plurality of layered structures and the organic pattern layer located at the bending region. The plurality of second holes pass through the plurality of layered structures located at the display region, wherein the plurality of second holes are adjacent to the bending region.

In an embodiment of the present disclosure, the plurality of first holes and the plurality of second holes have a first hole density and a second hole density, respectively, wherein the first hole density is greater than the second hole density.

In an embodiment of the present disclosure, the plurality of layered structures comprises: a protective layer, an organic layer, a line layer, a flat layer, a pixel defining layer, a spacing material layer, and a dispensing layer. The protective layer covers the organic pattern layer and the substrate located at the display region. The organic layer is disposed on the protective layer. The line layer is disposed on the organic layer. The flat layer is disposed on the line layer. The pixel defining layer is disposed on the flat layer. The spacing material layer is disposed on the pixel defining layer. The dispensing layer is disposed on the spacing material layer located at the bending region.

In an embodiment of the present disclosure, a thickness of the protective layer on the organic pattern layer is smaller than a thickness of the protective layer on the substrate of the display region.

In an embodiment of the present disclosure, material of the protective layer comprises polyimide.

Further, another embodiment of the present disclosure provides a method of fabricating a flexible display panel. The flexible display panel has a display region and a bending region. The method of fabricating the flexible display panel comprising steps of: providing a substrate; forming an organic pattern layer located at the bending region and on the substrate; covering a plurality of layered structures on the organic pattern layer and the substrate located at the display region; and forming a plurality of first holes and a plurality of second holes, wherein the plurality of first holes pass through the plurality of layered structures and the organic pattern layer located at the bending region, and the plurality of second holes pass through the plurality of layered structures located at the display region, wherein the plurality of second holes are adjacent to the bending region.

In an embodiment of the present disclosure, the plurality of first holes and the plurality of second holes have a first hole density and a second hole density, respectively, wherein the first hole density is greater than the second hole density.

In an embodiment of the present disclosure, the step of covering the plurality of layered structures comprises steps of: covering a protective layer on the organic pattern layer and the substrate located at the display region; forming an organic layer on the protective layer; forming a line layer on the organic layer; forming a flat layer on the line layer; forming a pixel defining layer on the flat layer; forming a spacing material layer on the pixel defining layer; and forming a dispensing layer on the spacing material layer located at the bending region.

In an embodiment of the present disclosure, a thickness of the protective layer on the organic pattern layer is smaller than a thickness of the protective layer on the substrate of the display region.

In an embodiment of the present disclosure, material of the protective layer comprises polyimide.

Compared with the conventional technologies, a flexible display panel and a method of fabricating the same of the present disclosure are to dispose the organic pattern layer such that the bending region produces a specific bending shape when bending, and the plurality of first holes and the second holes are formed to balance the stress, so as to solve the problems of the conventional technologies.

To make the above description of the present disclosure more clearly comprehensible, it is described in detail below in examples of preferred embodiments with the accompanying drawings.

DESCRIPTION OF SPECIFIC EMBODIMENTS OF THE INVENTION

The following description of the embodiments with reference to the appended drawings is used for illustrating specific embodiments which may be used for carrying out the present disclosure. Furthermore, the directional terms described by the present disclosure, such as upper, lower, top, bottom, front, back, left, right, inner, outer, side, around, center, horizontal, lateral, vertical, longitudinal, axial, radial, uppermost or lowermost, etc., are only directions by referring to the accompanying drawings. Thus, the used directional terms are used to describe and understand the present disclosure, but the present disclosure is not limited.

Figure 1:
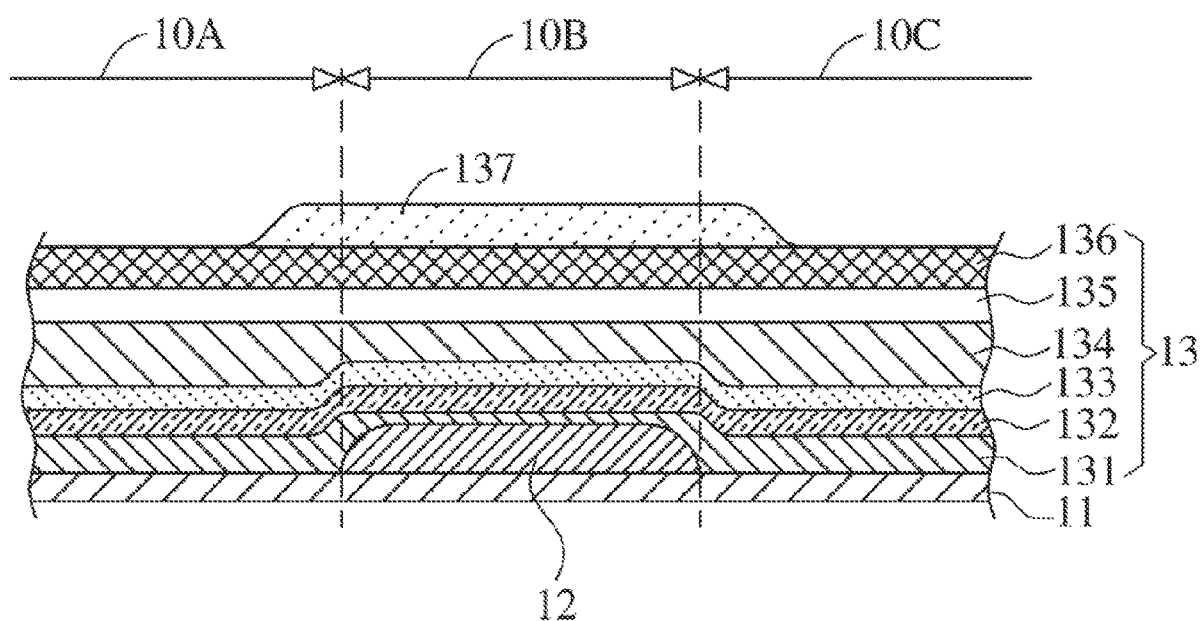
FIG. 1 is a schematic cross-sectional view of a flexible display panel in accordance with an embodiment of the present disclosure.
Figure 2:
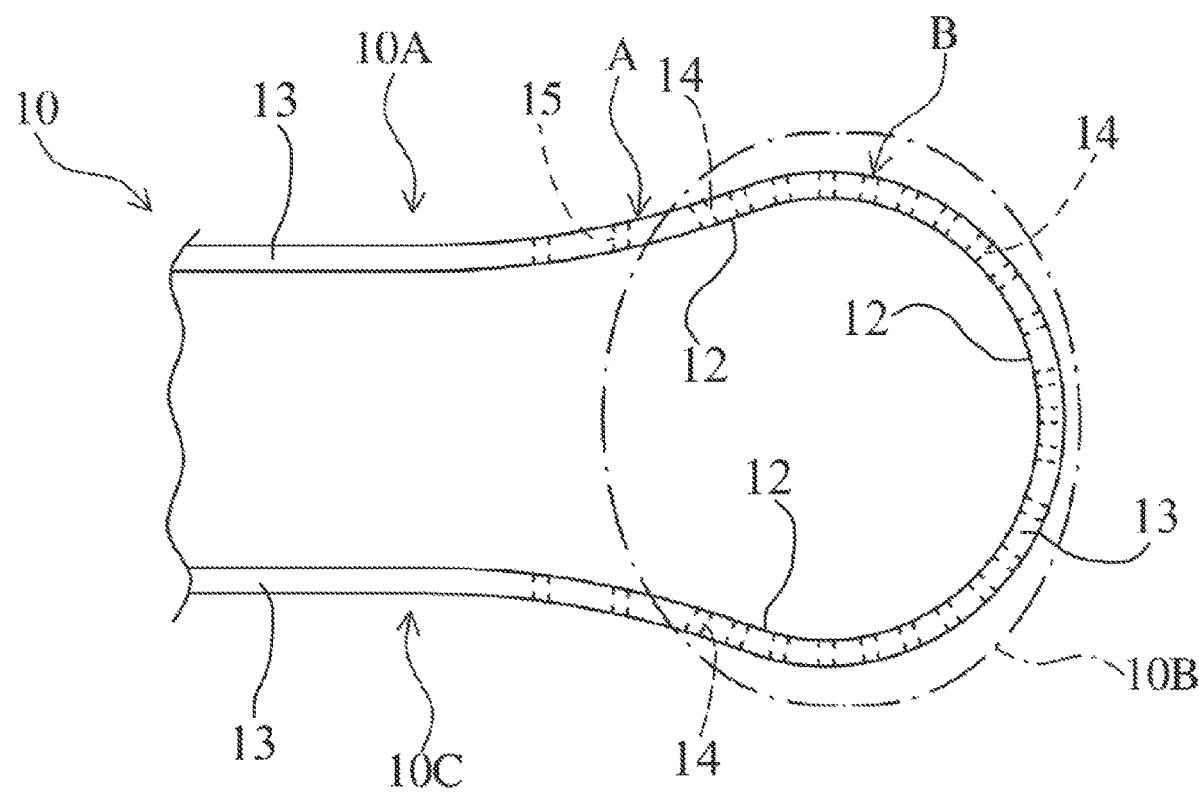
FIG. 2 is a schematic cross-sectional view of a flexible display panel when being bent according to an embodiment of the present disclosure.

Referring to FIG. 1 and FIG. 2, first holes and second holes are not shown in FIG. 1, and FIG. 2 mainly shows a position where the plurality of first holes and the plurality of second holes are formed. The flexible display panel 10 of an embodiment of the present disclosure has a display region 10A and a bending region 10B. The flexible display panel 10 includes a substrate 11, an organic pattern layer 12, a plurality of layered structures 13, a plurality of first holes 14, and a plurality of second holes 15. In an embodiment, the display region 10A is used to display a video or an image, and the bending region 10B is located, for example, at an edge portion (or a frame region) of the flexible display panel 10. In another embodiment, the flexible display panel 10 further includes an extending region 10C, wherein the bending region 10B is located between the extending region 10C and the display region 10A. In an example, when the bending region 10 is bent, the extending region 10C is located on a back side of the flexible display panel 10, and the display region 10A is located on a front side of the flexible display panel 10.

The substrate 11 of the flexible display panel 10 of an embodiment of the present disclosure is used to support the organic pattern layer 12 and the plurality of layer structures 13. In another embodiment, the substrate is, for example, a flexible substrate.

The organic pattern layer 12 of the flexible display panel 10 of an embodiment of the present disclosure is located on the bending region 10B and is disposed on the substrate 11. The organic pattern layer 12 is mainly used to generate a specific bending shape when the bending region 10B is bent, wherein the specific bending shape is matched with the plurality of first holes 14 and the plurality of seconds described below, so as to balance stress generated when bending.

The plurality of layered structures 13 of the flexible display panel 10 of an embodiment of the present disclosure cover the organic pattern layer 12 and the substrate 11 located at the display region 10A. In an embodiment, the plurality of layered structures 13 include: a protective layer 131, an organic layer 132, a line layer 133, a flat layer 134, a pixel defining layer 135, a spacing material layer 136, and an dispensing layer 137. The protective layer 131 covers the organic pattern layer 12 and the substrate 11 located at the display region 10A. The protective layer 131 mainly serves as a base layer for protecting an array structure (not shown). In an embodiment, material of the protective layer 131 comprises polyimide. The organic layer 132 is disposed on the protective layer 131. The line layer 133 is disposed on the organic layer 132 and can be used for current transmission. The flat layer 134 is disposed on the line layer 133 for planarizing the plurality of layered structures 13. The pixel defining layer 135 is disposed on the flat layer 134 for defining size of pixels. The spacing material layer 136 is disposed on the pixel defining layer 135. The dispensing layer 137 is disposed on the spacing material layer 136 of the bending region 10B for protecting the bending region 10B when the bending is performed.

In an embodiment, since polyimide (PI) has a certain fluidity, a part of the polyimide originally located on the organic pattern layer 12 flows to the display region 10A on the substrate 11 during formation of the protective layer 131.

Therefore, a thickness of the protective layer 131 on the organic pattern layer 12 is smaller than a thickness of the protective layer 131 on the substrate 11 located at the display region 10A.

The plurality of first holes 14 of the flexible display panel 10 of an embodiment of the present disclosure pass through the plurality of layered structures 13 and the organic pattern layer 12 of the bending region 10B, and the plurality of second holes 15 pass through the plurality of layered structures 13 located at the display region 10A, wherein the plurality of second holes 15 are adjacent to the bending region 10B. In an embodiment, the plurality of first holes 14 and the second holes 15 may be formed in a same lithography and etching process, or may be formed in different lithography and etching processes. In another embodiment, the plurality of first holes 14 and the plurality of second holes 15 have a first hole density and a second hole density, respectively, wherein the first hole density is greater than the second hole density.

It is noted here that the plurality of first holes 14 and the plurality of second holes 15 are mainly used to balance the stress generated when the bending region 10B is bent. Specifically, due to existence of the organic pattern layer 12 of the flexible display panel 10 of an embodiment of the present disclosure, the bending region 10B can be bent to produce a specific bending shape (as shown in FIG. 2, only an outer contour of a schematic diagram is shown). As indicated by an arrow A and an arrow B in FIG. 2, a region of the arrow A (i.e., the display region 10A adjacent to the bending region 10B) generates compressive stress, and a region of the arrow B (i.e., at the bending region 10B) generate tensile stress. Therefore, the compressive stress and the tensile stress at the arrow A and the arrow B can neutralize each other to some extent. On the other hand, the plurality of second holes 15 and the plurality of first holes 14 are respectively formed at the arrow A and the arrow B, so that the compressive stress and the tensile stress can be respectively released by deformation of the plurality of second holes 15 and the plurality of first holes 14.

Figure 3:
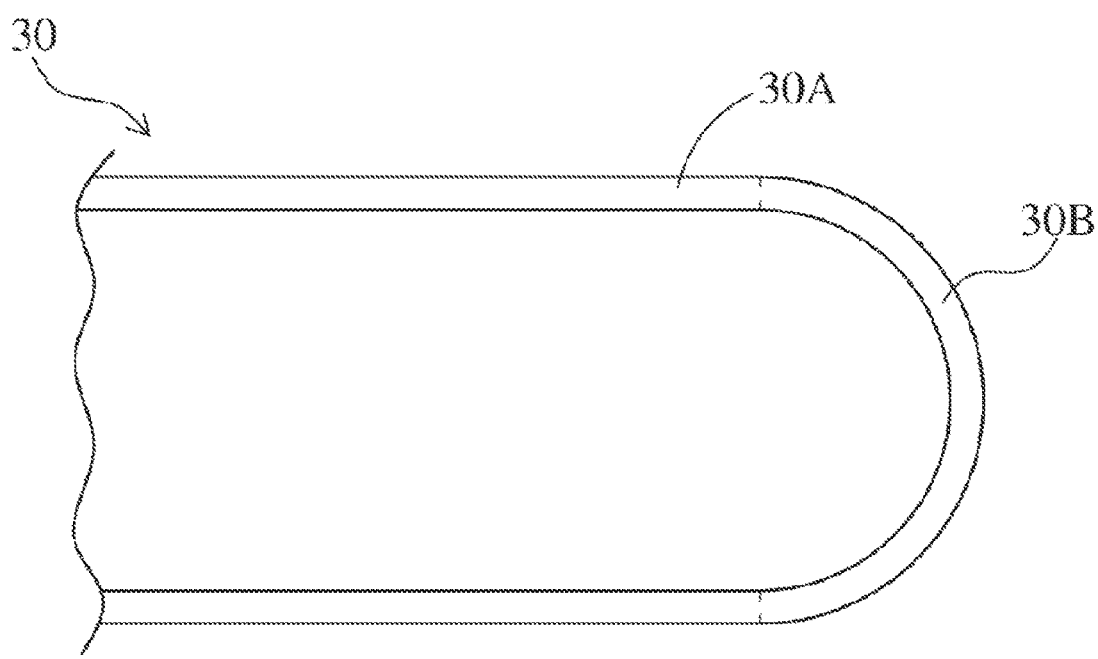
FIG. 3 is a schematic cross-sectional view showing a state in which a flexible display panel not provided with an organic pattern layer is bent.

It is noted that, in the case that the flexible display panel 30 does not have the organic pattern layer 12, the bending region 30B cannot be formed into a bending shape described above when bent (as shown in FIG. 3, only an outer contour of a schematic diagram is shown). Therefore, tensile stress generates at a bending region 30B, and no compressive stress is generated at a display region 30A adjacent to the bending region 30B. In other words, the tensile stress of the bending region 30B cannot be neutralized.

From above, a flexible display panel of the present disclosure is to dispose the organic pattern layer such that the bending region produces a specific bending shape when bending, and the plurality of first holes and the second holes are formed to balance the stress, so as to solve the problems of the conventional technologies.

Figure 4:
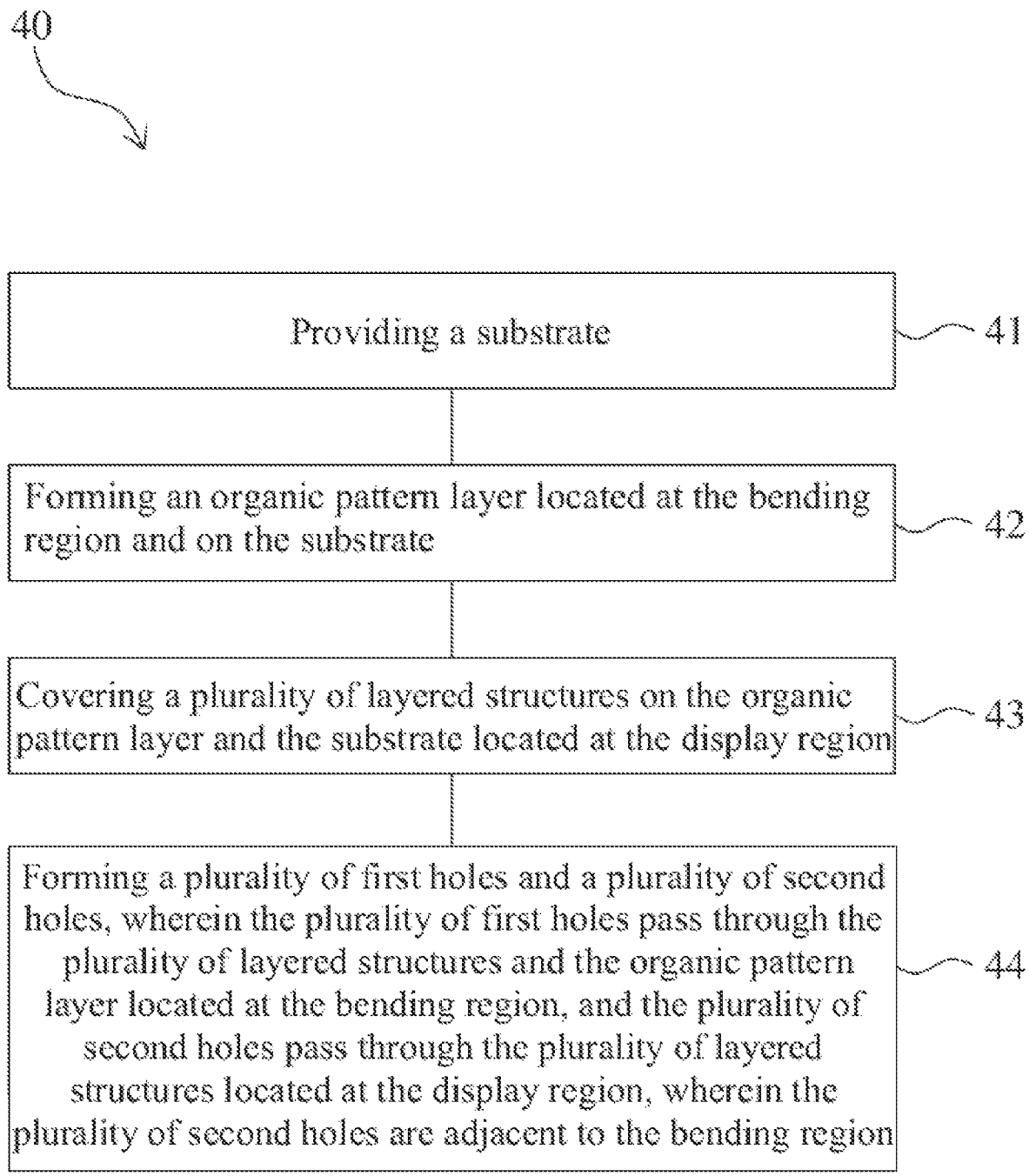
FIG. 4 is a flowchart of a method of fabricating a flexible display panel according to an embodiment of the present disclosure.

Referring to FIG. 4, another embodiment of the present disclosure provides a method 40 of fabricating a flexible display panel. The flexible display panel has a display region and a bending region. The method 40 of fabricating the flexible display panel comprising steps 41-44 of: providing a substrate (step 41); forming an organic pattern layer located at the bending region and on the substrate (step 42); covering a plurality of layered structures on the organic pattern layer and the substrate located at the display region (step 43); and forming a plurality of first holes and a plurality of second holes, wherein the plurality of first holes pass through the plurality of layered structures and the organic pattern layer located at the bending region, and the plurality of second holes pass through the plurality of layered structures located at the display region, wherein the plurality of second holes are adjacent to the bending region (step 44).

In an embodiment of the present disclosure, the method 40 of fabricating the flexible display panel has a step 41 of providing a substrate. In step 41, the substrate is used to support the organic pattern layer and the plurality of layer structures. In another embodiment, the substrate is, for example, a flexible substrate.

In an embodiment of the present disclosure, the method 40 of fabricating the flexible display panel has a step 42 of forming an organic pattern layer located at the bending region and on the substrate. In step 42, the organic pattern layer can be formed in the bending region and on the substrate by, for example, a lithography and etching process. The organic pattern layer is mainly used to generate a specific bending shape when the bending region is bent, wherein the specific bending shape is matched with the plurality of first holes and the plurality of seconds described below, so as to balance stress generated when bending.

In an embodiment of the present disclosure, the method 40 of fabricating the flexible display panel has a step 43 of covering a plurality of layered structures on the organic pattern layer and the substrate located at the display region. In step 43, for example, the step of covering the plurality of layered structures comprises steps of: covering a protective layer on the organic pattern layer and the substrate located at the display region; forming an organic layer on the protective layer; forming a line layer on the organic layer; forming a flat layer on the line layer; forming a pixel defining layer on the flat layer; forming a spacing material layer on the pixel defining layer; and forming a dispensing layer on the spacing material layer located at the bending region. In an embodiment, each of the above layered structures may be formed by an existing semiconductor process. In another embodiment, material of the protective layer comprises polyimide.

In an embodiment, since polyimide (PI) has a certain fluidity, a part of the polyimide originally located on the organic pattern layer flows to the display region on the substrate during formation of the protective layer. Therefore, a thickness of the protective layer on the organic pattern layer is smaller than a thickness of the protective layer on the substrate located at the display region.

In an embodiment of the present disclosure, the method 40 of fabricating the flexible display panel has a step 44 of forming a plurality of first holes and a plurality of second holes, wherein the plurality of first holes pass through the plurality of layered structures and the organic pattern layer located at the bending region, and the plurality of second holes pass through the plurality of layered structures located at the display region, wherein the plurality of second holes are adjacent to the bending region. In an embodiment, the plurality of first holes and the second holes may be formed in a same lithography and etching process, or may be formed in different lithography and etching processes. In another embodiment, the plurality of first holes and the plurality of second holes have a first hole density and a second hole density, respectively, wherein the first hole density is greater than the second hole density.

In an embodiment, the flexible display panel 10 of an embodiment of the present disclosure can be fabricated by the above-described method 40 of fabricating the flexible display panel of an embodiment of the present disclosure.

From above, a method of fabricating a flexible display panel of the present disclosure is to form the organic pattern layer such that the bending region produces a specific bending shape when bending, and the plurality of first holes and the second holes are formed to balance the stress, so as to solve the problems of the conventional technologies.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

What is claimed is:

1. A flexible display panel, having a display region and a bending region, and the flexible display panel comprising:
    a substrate;
    an organic pattern layer located at the bending region and disposed on the substrate;
    a plurality of layered structures covering the organic pattern layer and the substrate located at the display region, wherein the plurality of layered structures comprises:
    a protective layer covering the organic pattern layer and the substrate located at the display region;
    an organic layer disposed on the protective layer;
    a line layer disposed on the organic layer;
    a flat layer disposed on the line layer;
    a pixel defining layer disposed on the flat layer;
    a spacing material layer disposed on the pixel defining layer; and
    a dispensing layer disposed on the spacing material layer located at the bending region;
    a plurality of first holes passing through the plurality of layered structures and the organic pattern layer located at the bending region; and
    a plurality of second holes passing through the plurality of layered structures located at the display region, wherein the plurality of second holes are adjacent to the bending region, wherein the plurality of first holes and the plurality of second holes have a first hole density and a second hole density, respectively, wherein the first hole density is greater than the second hole density.

2. The flexible display panel according to claim 1, wherein a thickness of the protective layer on the organic pattern layer is smaller than a thickness of the protective layer on the substrate of the display region.

3. The flexible display panel according to claim 1, wherein material of the protective layer comprises polyimide.

4. A flexible display panel, having a display region and a bending region, and the flexible display panel comprising:
    a substrate;
    an organic pattern layer located at the bending region and disposed on the substrate;
    a plurality of layered structures covering the organic pattern layer and the substrate located at the display region;
    a plurality of first holes passing through the plurality of layered structures and the organic pattern layer located at the bending region; and
    a plurality of second holes passing through the plurality of layered structures located at the display region, wherein the plurality of second holes are adjacent to the bending region.

5. The flexible display panel according to claim 4, wherein the plurality of first holes and the plurality of second holes have a first hole density and a second hole density, respectively, wherein the first hole density is greater than the second hole density.

6. The flexible display panel according to claim 4, wherein the plurality of layered structures comprises:
    a protective layer covering the organic pattern layer and the substrate located at the display region;
    an organic layer disposed on the protective layer;
    a line layer disposed on the organic layer;
    a flat layer disposed on the line layer;
    a pixel defining layer disposed on the flat layer;
    a spacing material layer disposed on the pixel defining layer; and
    a dispensing layer disposed on the spacing material layer located at the bending region.

7. The flexible display panel according to claim 6, wherein a thickness of the protective layer on the organic pattern layer is smaller than a thickness of the protective layer on the substrate of the display region.

8. The flexible display panel according to claim 6, wherein material of the protective layer comprises polyimide.

* * * * *

UNITED STATES PATENT AND TRADEMARK OFFICE
CERTIFICATE OF CORRECTION

PATENT NO. : 11,387,296 B2
APPLICATION NO. : 16/612757
DATED : July 12, 2022
INVENTOR(S) : Hong Gao It is certified that error appears in the above-identified patent and that said Letters Patent is hereby corrected as shown below:

On the Title Page

In the item (73) Assignee:
"Wuhan China Star Optoelectronies Semiconductor Display Technology Co., Ltd."
Should be changed to:
--Wuhan China Star Optoelectronics Semiconductor Display Technology Co., Ltd.--

Signed and Sealed this
Seventeenth Day of January, 2023

Katherine Kelly Vidal
*Director of the United States Patent and Trademark Office*